United States Patent
Seki et al.

(10) Patent No.: US 8,279,010 B2
(45) Date of Patent: Oct. 2, 2012

(54) RADIO FREQUENCY POWER AMPLIFIER

(75) Inventors: Masato Seki, Osaka (JP); Masatoshi Kamitani, Osaka (JP); Katsuhiko Kawashima, Hyogo (JP); Masahiro Maeda, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/166,405

(22) Filed: Jun. 22, 2011

(65) Prior Publication Data

US 2012/0001695 A1     Jan. 5, 2012

(30) Foreign Application Priority Data

Jun. 30, 2010   (JP) ................................ 2010-150363

(51) Int. Cl.
      *H03F 3/68*           (2006.01)
(52) U.S. Cl. ................................... 330/295; 330/124 R
(58) Field of Classification Search .................. 330/295, 330/124 R, 84, 126, 302, 51
See application file for complete search history.

(56) References Cited

U.S. PATENT DOCUMENTS

| | | | |
|---|---|---|---|
| 5,548,246 A | 8/1996 | Yamamoto et al. | |
| 5,903,854 A | 5/1999 | Abe et al. | |
| 7,248,111 B1 | 7/2007 | Xu et al. | |
| 7,554,394 B2 * | 6/2009 | Maemura | 330/124 R |
| 8,049,558 B2 * | 11/2011 | Wyse et al. | 330/124 R |
| 2007/0222523 A1 | 9/2007 | Arell | |
| 2011/0001566 A1 | 1/2011 | Seki et al. | |
| 2011/0187451 A1 * | 8/2011 | Yoon et al. | 330/117 |
| 2012/0119829 A1 * | 5/2012 | Lee et al. | 330/124 R |

* cited by examiner

*Primary Examiner* — Henry Choe
(74) *Attorney, Agent, or Firm* — McDermott Will & Emery LLP

(57) ABSTRACT

The radio frequency power amplifier is connected between an other end of the first switching element and an other end of the second switching element, supplies power to a second amplifier via the first switching element and a second matching circuit, and includes a first power supply line for supplying power to the third amplifier via a second switching element and a third matching circuit, and the other end of the first switching element is connected to an input node of the first matching circuit, the other end of the second switching element is connected to the input node of the first matching circuit via the first power supply line, and an impedance of an output side of the RF power amplifier as viewed from an output node of the third amplifier is higher than an impedance of the RF power amplifier as viewed from an output node of the second amplifier.

6 Claims, 8 Drawing Sheets

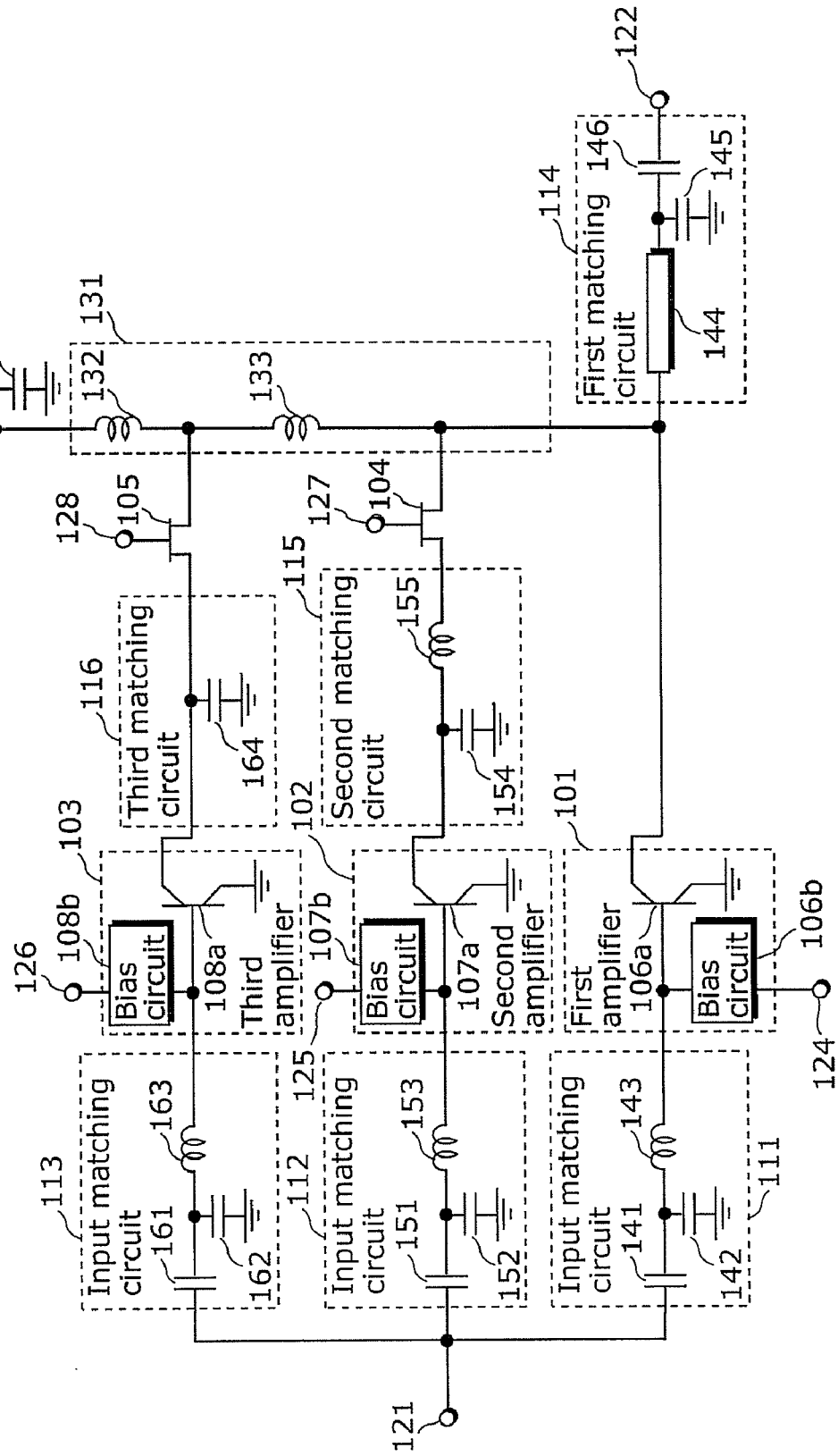

FIG. 2B

| | Bias circuit 106 (Terminal 124) | Bias circuit 107 (Terminal 125) | Bias circuit 108 (Terminal 126) | Switch 104 (Terminal 127) | Switch 105 (Terminal 128) |
|---|---|---|---|---|---|
| When high power output path is ON | ON (2.8V) | OFF (0V) | OFF (0V) | OFF (0V) | OFF (0V) |
| When middle power output path is ON | OFF (0V) | ON (2.8V) | OFF (0V) | ON (3.5V) | OFF (0V) |
| When low power output path is ON | OFF (0V) | OFF (0V) | ON (2.8V) | OFF (0V) | ON (3.5V) |

RADIO FREQUENCY POWER AMPLIFIER

BACKGROUND OF THE INVENTION (1) Field of the Invention

The present invention relates to a radio frequency (RF) power amplifier used for transmission in mobile communications such as cellular phone terminals.

(2) Description of the Related Art

To realize a light, compact cellular phone terminal which allows long-time communication, it is considered to be important to increase efficiency (decrease power consumption) of a transmission power amplifier which consumes a comparatively large amount of power, in addition to downsizing batteries. A transmission power amplifier for the cellular phone terminal is called a power amplifier (PA) module, for which a GaAs radio frequency transistor which excels in radio frequency characteristics and power conversion efficiency is mainly used. The GaAs RF transistor is roughly classified into: a field effect transistor (hereinafter described as FET) and a heterojunction bipolar transistor (hereinafter described as HBT).

In the CDMA schemes represented by wideband-code division multiple access (W-CDMA), a technique of controlling RF power that is output from an antenna of the mobile terminal is used according to a distance to a base station or surroundings such that the RF power arriving at each base station is almost equal. Generally, the level of output from the antenna is higher when the distance to the base station is longer, and the level of output from the antenna is lower when the distance is shorter. The output from the antenna is controlled by controlling the output level from the PA module. The output from the antenna, when used, is often suppressed to a relatively low level, and it is extremely important to realize increase in efficiency of the PA module under low output conditions in order to reduce power consumption. However, the power amplifier is designed to have highest power efficiency when the output level is high. Therefore, the power efficiency decreases when the level of output is less than the high output level.

As a means to improve efficiency at the time of middle output and low output, a PA module is suggested which switches an output path used for the output power that is required (Patent Reference 1: US Patent Application Publication No. 2007/0222523, DESCRIPTION). FIG. 7 is a block diagram of the PA module shown in Patent Reference 1.

Hereinafter, a conventional PA module will be described with reference to the diagram. Note that in the description below, the same numerical references will be assigned to the same elements.

First, an operation of a high power output path is described. An RF power, which is input from an input terminal 721, passes through an input matching circuit 711, to be input into a high output amplifier 701. The RF power, amplified by the high output amplifier 701, passes through the output matching circuit 714, to be output from an output terminal 722.

Next an operation of a middle power output path is described. An RF power, which is input from the input terminal 721, passes through the input matching circuit 712, to be input into a middle output amplifier 702. The RF power, amplified by the middle output amplifier 702, passes through a matching circuit 715, a switch 704, and the output matching circuit 714 in order, to be output from the output terminal 722.

Next an operation of a low power output path is described. An RF power, which is input from the input terminal 721, passes through an input matching circuit 713, to be input into a low output amplifier 703. The RF power, amplified by the low output amplifier 703, passes through a matching circuit 716, a switch 705, the matching circuit 715, the switch 704, and the output matching circuit 714 in order, to be output from the output terminal 722.

SUMMARY OF THE INVENTION

In the conventional circuit configuration as shown in FIG. 7, the matching circuits 715 and 716 need to be configured so as to optimize output impedance in each output path according to a very low output impedance of the high power output path, and this requires at least two components for each of the matching circuits (715 and 716), thus causing a problem of increase in circuit size. In addition, although a switch is provided for ensuring isolation of the paths from each other, the output signal from the low power output path, in the configuration of the conventional circuit as shown in FIG. 7, needs to pass through the two switches 704 and 705, thus deteriorating efficiency due to RF loss in the switches.

The present invention, in view of the problems above, provides an RF power amplifier which improves, without increasing circuit size, power efficiency in an RF power amplifier which selects and uses, from among a plurality of paths for amplifying signals, a path according to the power output that is required.

To solve the problem above, an RF power amplifier according to an aspect of the present invention is a radio frequency (RF) power amplifier which includes: a first amplifier which amplifies an RF signal; a second amplifier which amplifies the RF signal; a third amplifier which amplifies the RF signal; a first matching circuit connected to an output node of the first amplifier; a second matching circuit connected to an output node of the second amplifier; a third matching circuit connected to an output node of the third amplifier; an output terminal connected to an output node of the first matching circuit; a first switching element having one end connected to an output node of the second matching circuit; a second switching element having one end connected to an output node of the third matching circuit; and a first power supply line which is connected between an other end of the first switching element and an other end of the second switching element, and is for supplying power to the second amplifier via the first switching element and the second matching circuit and supplying power to the third amplifier via the second switching element and the third matching circuit, and, in the RF power amplifier, the other end of the first switching element is connected to an input node of the first matching circuit, the other end of the second switching element is connected to the input node of the first matching circuit via the first power supply line, and an impedance at an output side of the RF power amplifier as viewed from the output node of the third amplifier is higher than an impedance at the output side of the RF power amplifier as viewed from the output node of the second amplifier.

With this configuration, each of the RF signals output from the second and third amplifiers is transmitted to an input node of the first matching circuit, via a corresponding one of the first and second switches, respectively, and further via the first power supply line. Thus, by using the first power supply line as a transmission path of the output RF signal, it is possible to reduce the circuit size and the number of components of each matching circuit, thus promoting downsizing and cost reduction. In addition, since each of the signals from the second amplifier and the third amplifier passes through only a single-stage switching element, it is possible to reduce loss caused by passing through switching elements and improve power efficiency.

Here, the RF power amplifier may further include a second power supply line connected between the output node of the first amplifier and the other end of the first switching element, and in the RF power amplifier, the other end of the first switching element may be connected to the input node of the first matching circuit via the second power supply line, and the other end of the second switching element may be connected to the input node of the first matching circuit via the first power supply line and the second power supply line.

With this configuration, it is possible to reduce the circuit size and the number of components of each of the matching circuits by using the second power supply line as another transmission path for an output signal, thus promoting downsizing, cost reduction, and improvement in power efficiency.

Here, the first amplifier may include a transistor having a cell size larger than a cell size of a transistor included in the second amplifier, and the second amplifier may include the transistor having the cell size larger than a cell size of a transistor included in the third amplifier.

With this configuration, since the RF power is larger in order of the first, the second, and the third amplifiers, and the output signal from the first amplifier having the highest RF power is not transmitted via any switching element, it is possible to reduce loss further than reducing the loss in the output signals from the second and third amplifiers.

Here, each of the first power supply line and the second power supply line may include an inductor component.

With this configuration, it is possible to use the first and second power supply lines as part of the transmission path.

Here, each of the first power supply line and the second power supply line may be formed of a microstrip line laid out on a substrate.

With this configuration, it is possible to use the first and second power supply lines as part of the matching circuit, thus facilitating design and downsizing.

Here, the first amplifier may include a first transistor which amplifies the RF signal that is input into a base of the first transistor, and a first bias circuit which turns on to supply bias current to the base of the first transistor and turns off not to supply the bias current, the second amplifier may include a second transistor which amplifies the RF signal that is input into a base of the second transistor, and a second bias circuit which turns on to supply bias current to the base of the second transistor and turns off not to supply the bias current, the third amplifier may include a third transistor which amplifies the RF signal that is input into a base of the third transistor, and a third bias circuit which turns on to supply bias current to the base of the third transistor and turns off not to supply the bias current, and, in a first operation mode, the first bias circuit may be ON, the second bias circuit may be OFF, the third bias circuit may be OFF, the first switching element may be OFF, and the second switching element may be OFF, in a second operation mode, the first bias circuit may be OFF, the second bias circuit may be ON, the third bias circuit may be OFF, the first switching element may be ON, and the second switching element may be OFF, and in a third operation mode, the first bias circuit may be OFF, the second bias circuit may be OFF, the third bias circuit may be ON, the first switching element may be OFF, and the second switching element may be ON.

With this configuration, the RF power amplifier capable of switching RF signal power allows suppressing loss and achieving downsizing and cost reduction.

According to the present invention, it is possible to improve power efficiency at the time of middle output and low output, without increasing circuit size, in an RF power amplifier which operates by switching between a high power output path, a middle power output path, and a low power output path according to the required output power.

FURTHER INFORMATION ABOUT TECHNICAL BACKGROUND TO THIS APPLICATION

The disclosure of Japanese Patent Application No. 2010-150363 filed on Jun. 30, 2010 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 2A is a circuit diagram of the PA module according to the first embodiment of the present invention;

FIG. 2B is a block diagram showing an operation state of the PA module according to the first embodiment of the present invention;

DESCRIPTION OF THE PREFERRED EMBODIMENTS

Hereinafter, an RF power amplifier according to embodiments of the present invention will be described with reference to the drawings.

(First Embodiment)

Figure 1:
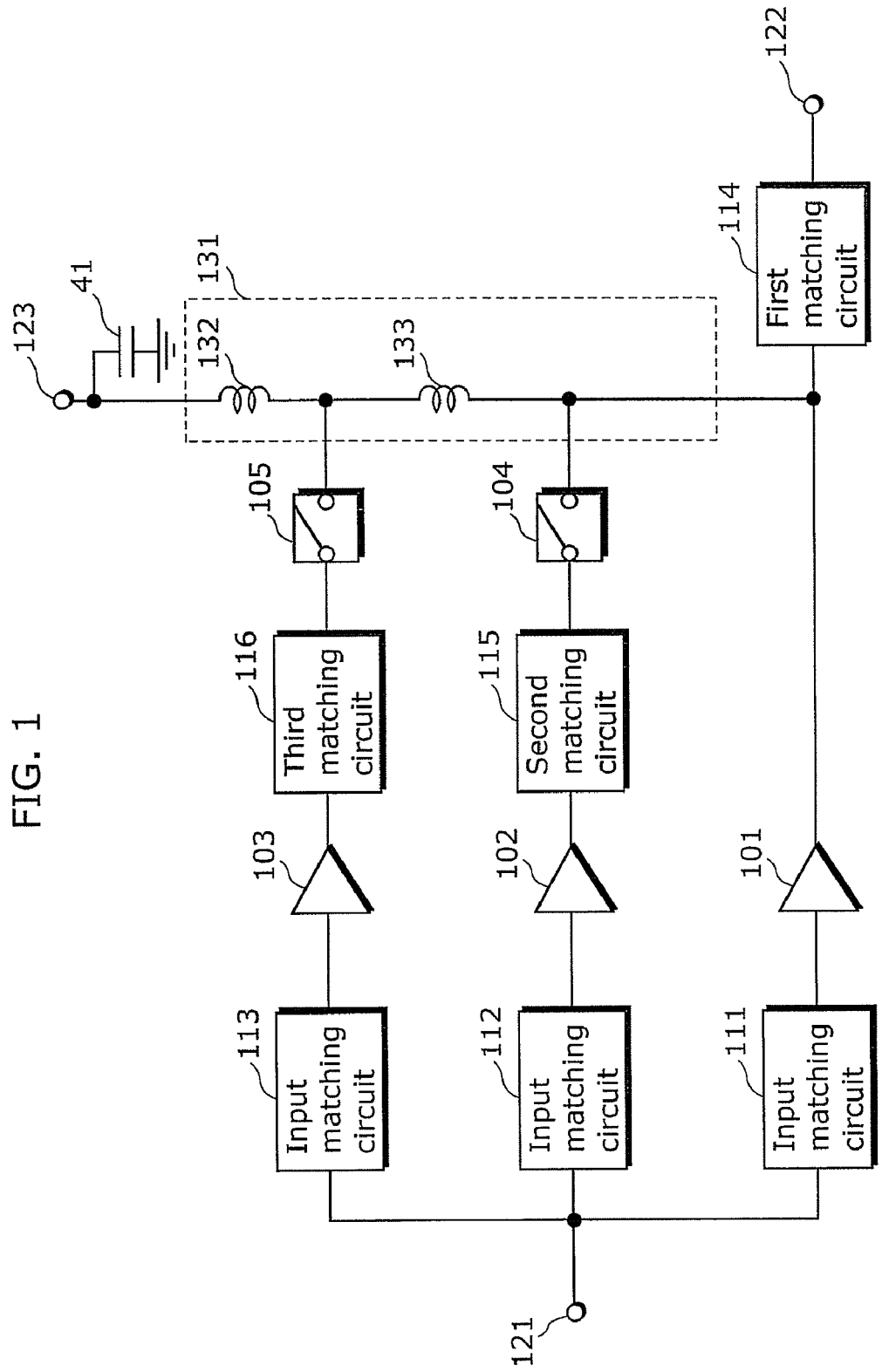
FIG. 1 is a block diagram of a PA module according to a first embodiment of the present invention.

FIG. 1 is a block diagram of an RF power amplifier (also referred to as a PA module) according to a first embodiment of the present invention, and FIG. 2A shows an example of a circuit configuration of a PA module according to the first embodiment.

As shown in FIG. 1, the RF power amplifier includes: an input terminal 121, a first amplifier 101, a second amplifier 102, a third amplifier 103, input matching circuits 111 to 113, a first matching circuit 114, a second matching circuit 115, a third matching circuit 116, an output terminal 122, a switch (first switching element) 104, a switch (second switching element) 105, a power supply line 131, and a condenser 41.

An RF signal is applied to the input terminal 121. The input matching circuit 111 performs impedance matching between the input terminal 121 and the first amplifier 101. The input matching circuit 112 performs impedance matching between the input terminal 121 and the second amplifier 102. The input matching circuit 113 performs impedance matching between the input terminal 121 and the third amplifier 103.

The first amplifier 101 amplifies the RF signal from the input matching circuit 111. The second amplifier 102 amplifies the RF signal from the input matching circuit 112. The third amplifier 103 amplifies the RF signal from the input matching circuit 113. The RF power is larger in order of the first amplifier 101, the second amplifier 102, and the third amplifier 103, and these amplifiers are selectively switched.

The first matching circuit 114 is connected to an output node of the first amplifier, and outputs the RF signal via the output terminal 122. The first matching circuit 114 includes, for example, a microstrip line 144, a shunt condenser 145, and a series condenser 146.

The second matching circuit 115 is connected to an output node of the second amplifier.

The third matching circuit 116 is connected to an output node of the third amplifier.

The output terminal 122 is connected to an output node of the first matching circuit 114.

The first switching element 104 has one end connected to the output node of the second matching circuit 115 and the other end connected to the input node of the first matching circuit 114.

The second switching element 105 has one end connected to the output node of the third matching circuit 116 and the other end connected to the input node of the first matching circuit 114 via a first power supply line 133.

The power supply line 131 is a power supply line for supplying power to: the first amplifier 101; the second amplifier 102 via the first switching element 104 and the second matching circuit 115; and the third amplifier 103 via the second switching element 105 and the third matching circuit 116. The power supply line 131 includes the first power supply line 133. The first power supply line 133 is a power supply line which is connected between the other end of the first switching element 104 and the other end of the second switching element 105, and is for supplying power to: the second amplifier 102 via the first switching element 104 and the second matching circuit 115; and the third amplifier 103 via the second switching element 105 and the third matching circuit 116.

Thus, the RF power signals, output from the second and third amplifiers 102 and 103, are transmitted to the input node of the first matching circuit 114 via the first and second switching elements 104 and 105, respectively, and further via the first power supply line 133. In addition, the first amplifier 101 also uses the line through which the power from the power supply line 131 is supplied as a transmission path of an RF signal. Thus, the first power supply line 133 is used not only for power supply but also as a transmission path for RF signals. With this, it is possible to reduce the circuit size and the number of components of each of the matching circuits, thus promoting downsizing and cost reduction.

The output side of the RF power amplifier as viewed from the output node of the third amplifier 103 has higher impedance than impedance of the output side of the RF power amplifier as viewed from the output node of the second amplifier 102. For example, the cell size of a transistor included in the first amplifier 101 is larger than the cell size of a transistor included in the second amplifier 102, and the cell size of a transistor included in the second amplifier 102 is larger than the cell size of a transistor included in the third amplifier 103.

With this configuration, since the RF power is larger in order of the first, the second, and the third amplifiers, and the output signal from the first amplifier having the highest RF power is not transmitted via any switching element, it is possible to reduce the loss further than reducing the loss in the output signals from the second and third amplifiers. In addition, since each of the output signals from the second and the third amplifiers passes through only a single-stage switching element, it is possible to suppress as much loss as possible caused by passing through switching elements.

In FIG. 2A, a transmission path including the first amplifier 101 is referred to as a high power output path, a transmission path including the second amplifier 102 is referred to as a middle power output path, and a transmission path including the third amplifier 103 is a low power output path.

Hereinafter, the description will be given in more detail with reference to FIG. 2A. First, an operation of the high power output path is described. An RF power, which is input from an input terminal 121, passes through an input matching circuit 111, to be input into the first amplifier 101 for high output. The input matching circuit 111 includes, in order, starting from the input terminal 121: a series condenser 141, a shunt condenser 142, and a series inductor 143. The RF power, amplified by the first amplifier 101 for high output, passes through the first matching circuit 114, to be output from the output terminal 122. The collector power supply terminal 123 is connected to a collector of the first amplifier 101 for high output via the power supply line 131. To the collector power supply terminal 123, a grounding condenser 41 having one end earthed is connected. The base power supply terminal 124 is connected to a base of a transistor 106a in the first amplifier 101 for high output via a bias circuit 106b. The bias circuit 106b functions as a circuit for supplying current to the base of the transistor 106a.

Next an operation of the middle power output path is described. An RF power, which is input from the input terminal 121, passes through the input matching circuit 112, to be input into the second amplifier 102 for middle output. The input matching circuit 112 includes, in order, starting from the input terminal 121: a series condenser 151, a shunt condenser 152, and a series inductor 153. The RF power, amplified by the second amplifier 102 for middle output, passes through the second matching circuit 115, the switch 104, and the first matching circuit 114 in order, to be output from the output terminal 122. The second matching circuit 115 includes, starting from the second amplifier 102 for middle output, a shunt condenser 154, and a series inductor 155. The switch 104 is Single Pole Single Throw (SPST) using a GaAs FET. A base power supply terminal 125 is connected to a base of a transistor 107a in the second amplifier 102 for middle output via a bias circuit 107b. The bias circuit 107b functions as a circuit for supplying current to the base of the transistor 107a. In addition, the cell size of the transistor 107a in the second amplifier 102 for middle output is optimized according to the output level, and is smaller than the cell size of the transistor 106a in the first amplifier 101 for high output.

Next an operation of the low power output path is described. An RF power, which is input from the input terminal 121, passes through the input matching circuit 113, to be input into the third amplifier 103 for low output. The input matching circuit 113 includes, in order, starting from the input terminal 121: a series condenser 161, a shunt condenser 162, and a series inductor 163. The RF power, amplified by the third amplifier 103 for low output, passes through the first power supply line 133 that is part of the power supply line 131, and the first matching circuit 114 in order, via the third matching circuit 116 and the switch 105, to be output from the output terminal 122. A power supply line 132 constituting a portion of the power supply line 131 other than the first power supply line 133 functions as a choke inductor for the power. The switch 105 is a SPST using a GaAs FET. A base power supply terminal 126 is connected to a base of the third amplifier 103 for low output via a bias circuit 108b. The bias circuit 108b functions as a circuit for supplying current to a base of a transistor 108a in the third amplifier 103 for low output.

FIG. 2B is a diagram showing an operation state of the PA module. The figure shows: bias circuits 106b, 107b, and 108b during operation of the high power output path, the middle power output path, and the low power output path, respectively; an operation state (ON or OFF) of each of the first switching element 104 and the second switching element 105; and an example of voltage applied to terminals 124 to 128. Here, as an example, the base power supply terminals 124, 125, and 126 apply 2.8 V in ON state, and apply 0 V in OFF state. On the other hand, the switch control terminals 127 and 128 apply 3.5 V in ON state, and apply 0 V in OFF state.

According to the first embodiment of the present invention as shown in FIG. 2A, it is possible to produce an advantageous effect of improving efficiency in the low power output path by designing optimal values of the power supply line 132, the first power supply line 133, and the shunt condenser 164 such that the output impedance of the low power output path is higher than the output impedances of the middle power output path and the high power output path. Furthermore, since the first power supply line 133 is used as part of the output matching circuit of the low power output path, it is possible reduce the number of components in the third matching circuit 116, thus it is effective in downsizing and cost reduction.

Furthermore, compared to the PA module having a conventional configuration, the RF output signal from the low power output path passes through only one switch 105, thus allowing reduction in RF loss caused by passing through the switch, to achieve improvement in power efficiency at the time of low output.

In addition, the cell size of the transistor 108a included in the third amplifier 103 for low output is optimized according to the output level, and is smaller than the cell size of the transistor 107a in the second amplifier 102 for middle output.

(Second Embodiment)

Figure 3:
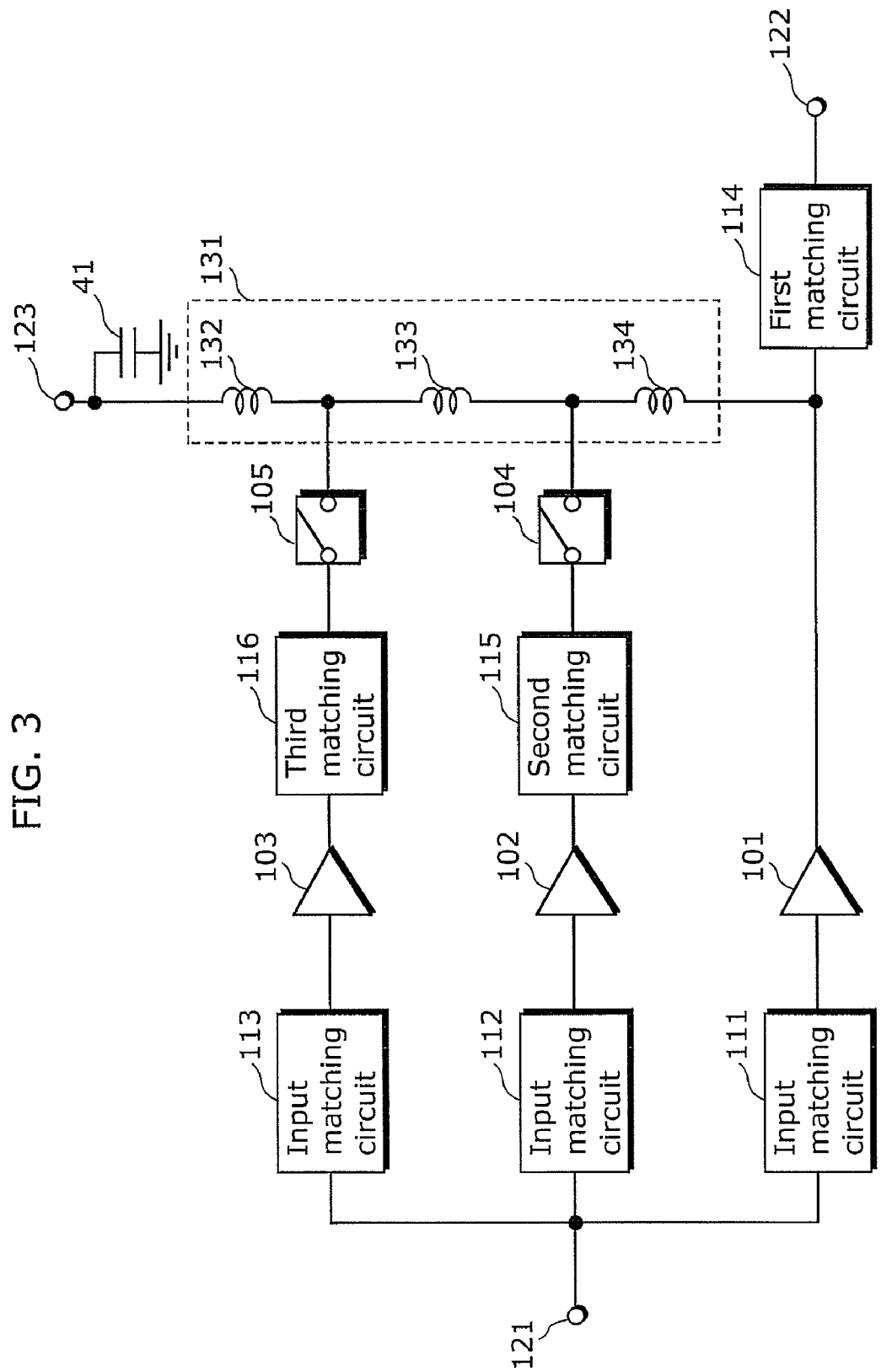
FIG. 3 is a block diagram of a PA module according to a second embodiment of the present invention.
Figure 4:
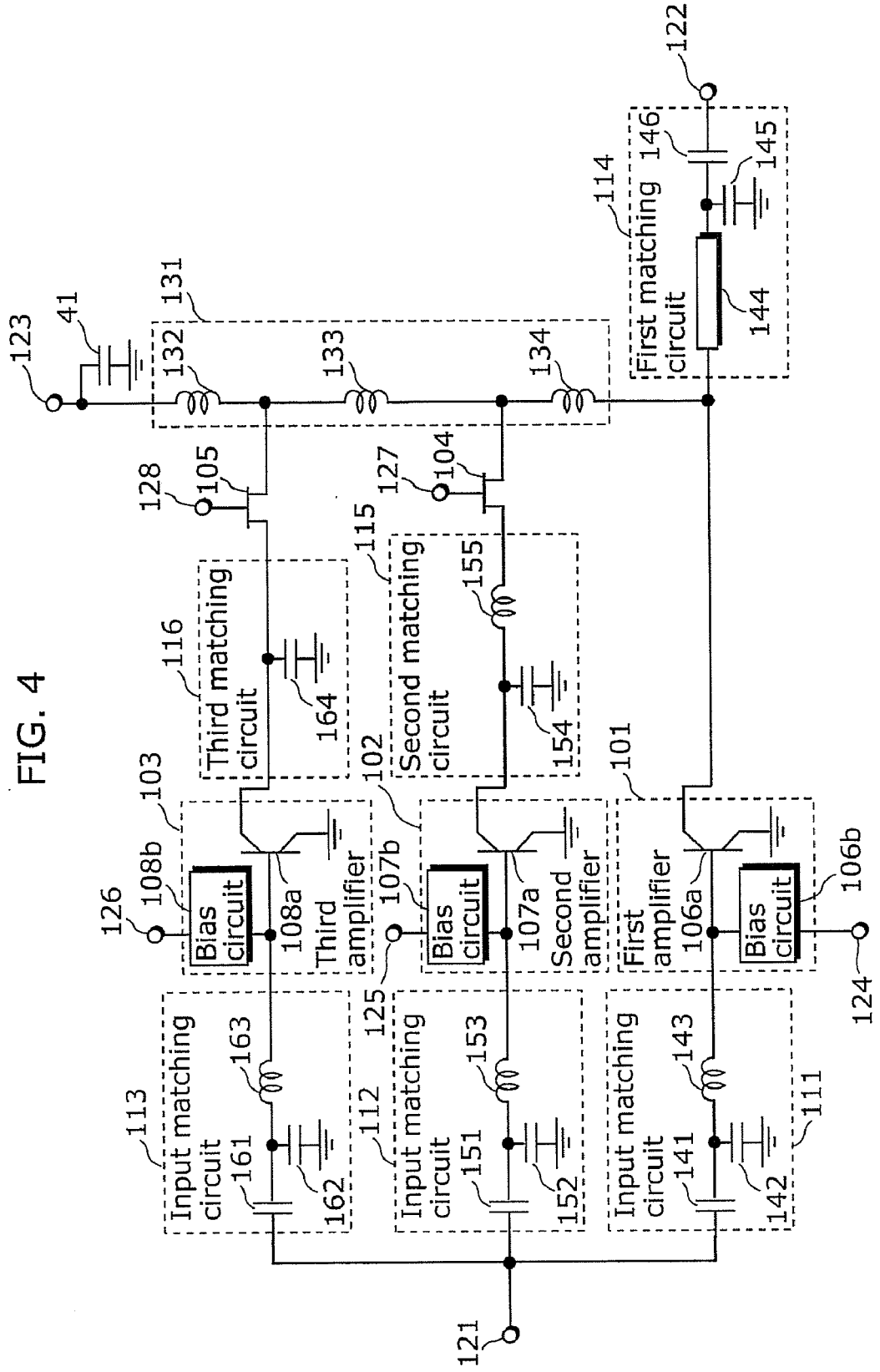
FIG. 4 is a circuit diagram of the PA module according to the second embodiment of the present invention.

FIG. 3 is a block diagram of a PA module according to a second embodiment of the present invention, and FIG. 4 shows an example of a circuit configuration of the PA module according to the second embodiment.

The difference from the PA module according to the first embodiment as shown in FIG. 2 is that: the output node of the switch 104 in the middle power output path is connected between the first power supply line 133 that is part of the power supply line 131 and a second power supply line 134. In other words, the RF power amplifier includes the second power supply line 134, which is connected between the output node of the first amplifier 101 and the other end of the switch (the first switching element) 104. Here, the other end of the switch 104 is connected to the input node of the first matching circuit 114 via the second power supply line 134. The other end of the switch (the second switching element) 105 is connected to the input node of the first matching circuit 114 via the first and second power supply lines 133 and 134. Thus, the RF power, amplified by the second amplifier 102 for middle output, passes through the second matching circuit 115, the switch 104, the second power supply line 134 that is part of the power supply line 131, and the first matching circuit 114 in order, to be output from the output terminal 122. The same advantageous effect of improving efficiency in the low power output path can be obtained by adjusting the values of the first power supply line 133, the second power supply line 134, and the shunt condenser 164 such that the output impedance of the low power output path is larger than the output impedances of the middle power output path and the high power output path. In addition, since the second power supply line 134 is used as part of the output matching circuit of the middle power output path, it is possible to configure the second matching circuit 115 only with the shunt condenser 154, thus reducing the number of components as well as producing an effect of downsizing and cost reduction.

(Third Embodiment)

Figure 5:
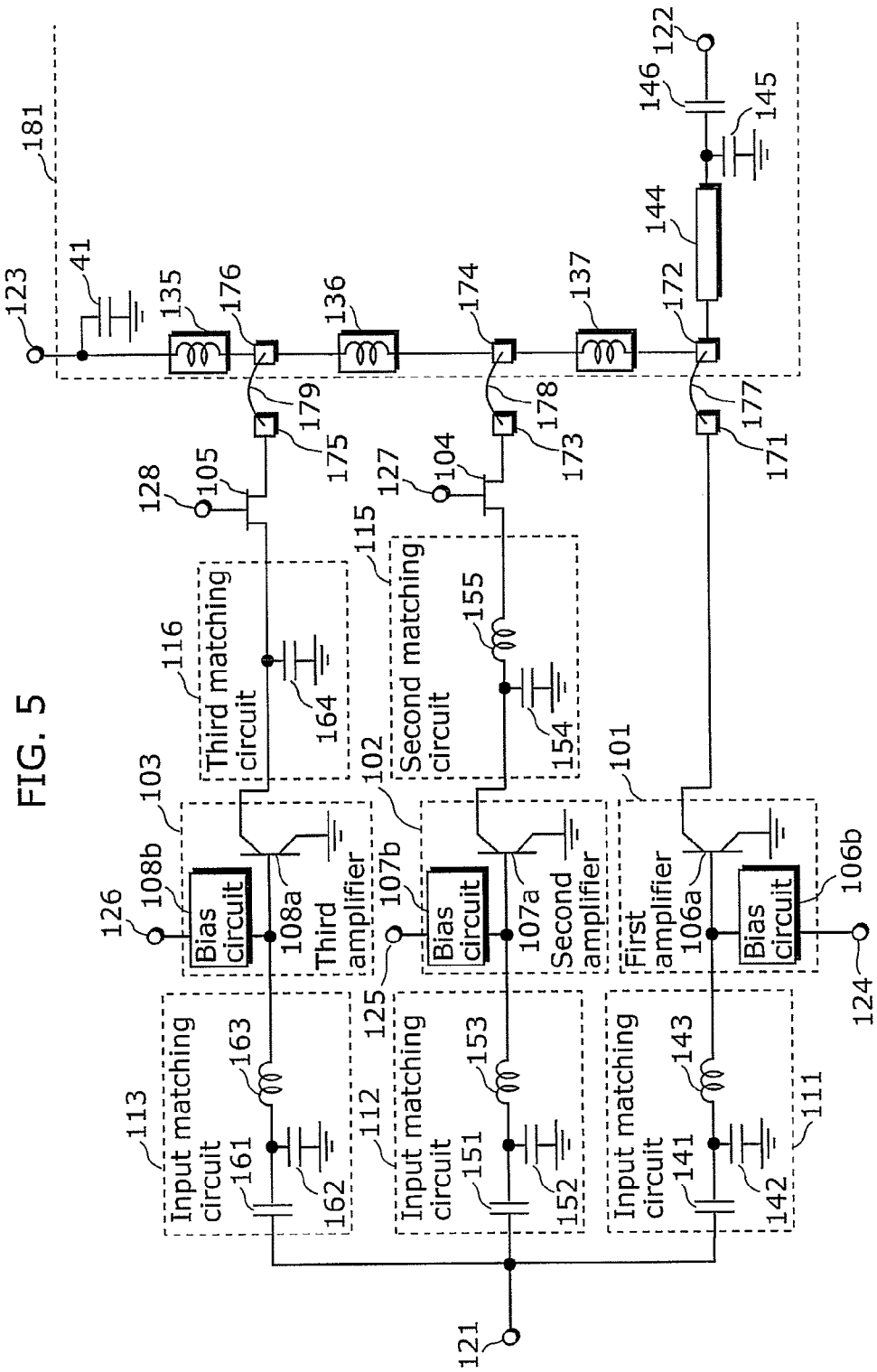
FIG. 5 is a circuit diagram of a PA module according to a third embodiment of the present invention.

FIG. 5 is a circuit diagram of the PA module according to a third embodiment of the present invention. The figure shows a specific configuration example of the PA module according to the second embodiment as shown in FIG. 4. The difference from the PA module in FIG. 4 according to the second embodiment is that: the power supply lines 132, 133, and 134 are replaced by inductor components (for example, chip inductors) 135, 136, and 137, respectively, which are formed on a resin substrate 181; and wire pads 171, 173, and 175 on a GaAs chip are connected to wire pads 172, 174, and 176 via bonding wires 177, 178, and 179 on the resin substrate 181, respectively. It is possible to improve RF characteristics by forming the power supply lines using low-loss chip components.

(Fourth Embodiment)

Figure 6:
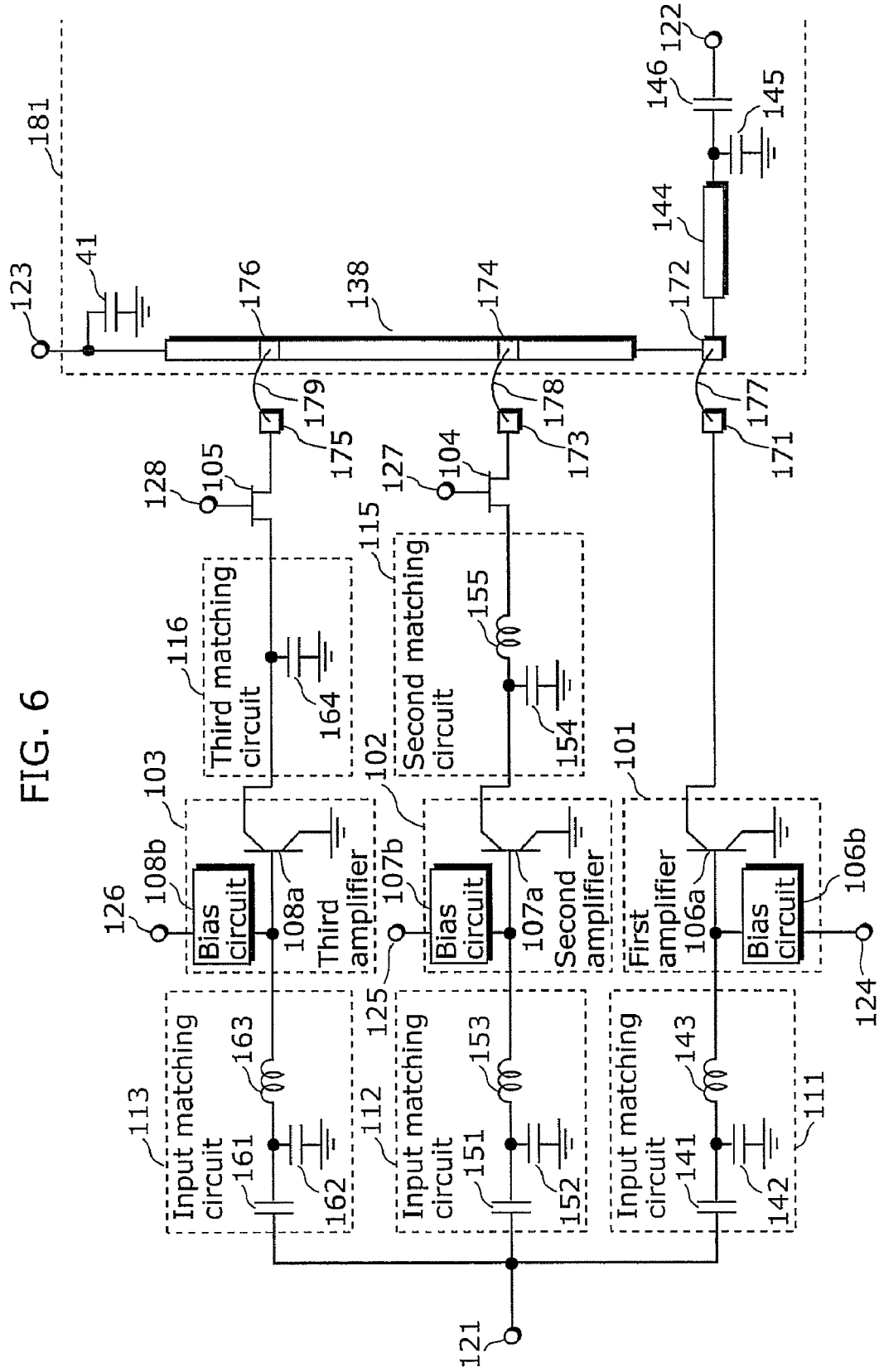
FIG. 6 is a circuit diagram of a PA module according to a fourth embodiment of the present invention.
Figure 7:
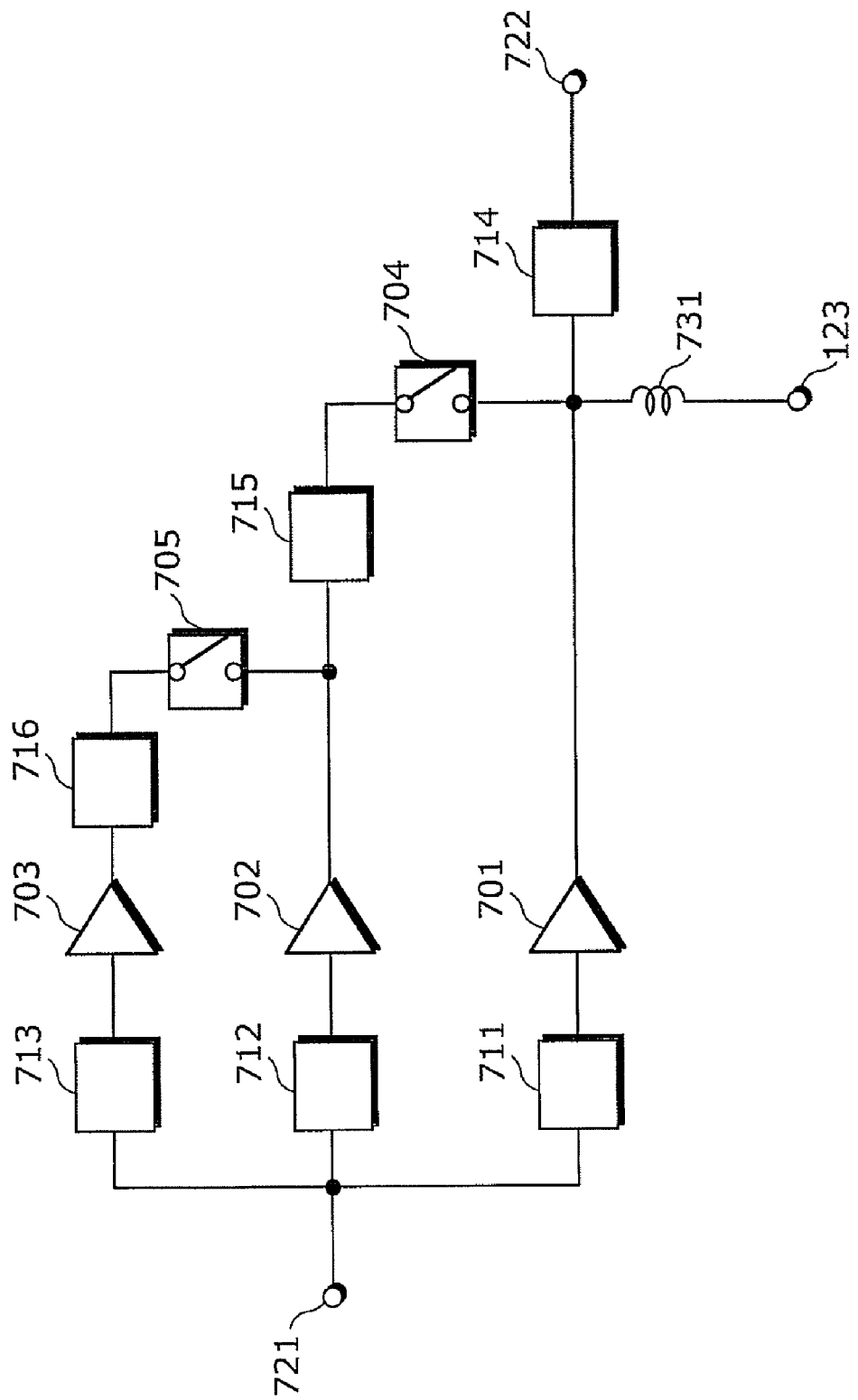
FIG. 7 is a block diagram of a PA module according to the conventional technique.

FIG. 6 is a circuit diagram of the PA module according to a fourth embodiment of the present invention. The difference from the PA module according to the third embodiment as shown in FIG. 5 is that: the inductor components 135, 136, and 137 as shown in FIG. 5 are formed using a microstrip line 138 on the resin substrate 181, thus allowing further downsizing using the wire pads 172, 174, and 176 on the microstrip.

In the embodiments described above, the cases of using a GaAsHBT for the RF transistor has been considered, but the same advantageous effect can be produced using another RF transistor. In addition, such an advantageous effect can be produced irrespective of the number of stages of the transistor.

In addition, in the embodiments above, the cases of providing three paths for the output path has been considered, but the same advantageous effect can be produced by providing two paths, or four or more paths for the output path.

In addition, the configuration of the matching circuit is not limited to the configuration described in the embodiments above.

In addition, the configuration of the power supply line described in the above embodiments may be a combination of a chip inductor and a microstrip line.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

Industrial Applicability

An RF power amplifier according to the present invention is capable of achieving high efficiency in middle and low output conditions, and is useful as a technique used for a transmission device in mobile communications, such as a cellular phone terminal.

What is claimed is:

1. A radio frequency (RF) power amplifier, comprising:
a first amplifier which amplifies an RF signal;
a second amplifier which amplifies the RF signal;
a third amplifier which amplifies the RF signal;
a first matching circuit connected to an output node of said first amplifier;
a second matching circuit connected to an output node of said second amplifier;
a third matching circuit connected to an output node of said third amplifier;

an output terminal connected to an output node of said first matching circuit;

a first switching element having one end connected to an output node of said second matching circuit;

a second switching element having one end connected to an output node of said third matching circuit; and a first power supply line which is connected between an other end of said first switching element and an other end of said second switching element, and is for supplying power to said second amplifier via said first switching element and said second matching circuit and supplying power to said third amplifier via said second switching element and said third matching circuit, wherein the other end of said first switching element is connected to an input node of said first matching circuit, the other end of said second switching element is connected to the input node of said first matching circuit via said first power supply line, and an impedance at an output side of said RF power amplifier as viewed from the output node of said third amplifier is higher than an impedance at the output side of said RF power amplifier as viewed from the output node of said second amplifier.

2. The RF power amplifier according to claim 1, further comprising a second power supply line connected between the output node of said first amplifier and the other end of said first switching element, wherein the other end of said first switching element is connected to the input node of said first matching circuit via said second power supply line, and the other end of said second switching element is connected to the input node of said first matching circuit via said first power supply line and said second power supply line.

3. The RF power amplifier according to claim 2, wherein said first amplifier includes a transistor having a cell size larger than a cell size of a transistor included in said second amplifier, and said second amplifier includes the transistor having the cell size larger than a cell size of a transistor included in said third amplifier.

4. The RF power amplifier according to claim 2, wherein each of said first power supply line and said second power supply line includes an inductor component.

5. The RF power amplifier according to claim 2, wherein each of said first power supply line and said second power supply line is formed of a microstrip line laid out on a substrate.

6. The radio frequency power amplifier according to claim 1, wherein said first amplifier includes a first transistor which amplifies the RF signal that is input into a base of said first transistor, and a first bias circuit which turns on to supply bias current to the base of said first transistor and turns off not to supply the bias current, said second amplifier includes a second transistor which amplifies the RF signal that is input into a base of said second transistor, and a second bias circuit which turns on to supply bias current to the base of said second transistor and turns off not to supply the bias current, said third amplifier includes a third transistor which amplifies the RF signal that is input into a base of said third transistor, and a third bias circuit which turns on to supply bias current to the base of said third transistor and turns off not to supply the bias current, in a first operation mode, said first bias circuit is ON, said second bias circuit is OFF, said third bias circuit is OFF, said first switching element is OFF, and said second switching element is OFF, in a second operation mode, said first bias circuit is OFF, said second bias circuit is ON, said third bias circuit is OFF, said first switching element is ON, and said second switching element is OFF, and in a third operation mode, said first bias circuit is OFF, said second bias circuit is OFF, said third bias circuit is ON, said first switching element is OFF, and said second switching element is ON.

* * * * *